United States Patent
Kitagawa et al.

(10) Patent No.: US 9,117,924 B2
(45) Date of Patent: Aug. 25, 2015

(54) MAGNETIC MEMORY ELEMENT AND METHOD OF MANUFACTURING THE SAME

(71) Applicants: Eiji Kitagawa, Yokohama (JP); Chikayoshi Kamata, Kawasaki (JP); Saori Kashiwada, Yokohama (JP); Yushi Kato, Chofu (JP); Tadaomi Daibou, Yokohama (JP)

(72) Inventors: Eiji Kitagawa, Yokohama (JP); Chikayoshi Kamata, Kawasaki (JP); Saori Kashiwada, Yokohama (JP); Yushi Kato, Chofu (JP); Tadaomi Daibou, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 25 days.

(21) Appl. No.: 13/729,297

(22) Filed: Dec. 28, 2012

(65) Prior Publication Data
US 2013/0307099 A1    Nov. 21, 2013

(30) Foreign Application Priority Data
May 18, 2012 (JP) ................................ 2012-114951

(51) Int. Cl.
*H01L 29/82* (2006.01)
*H01L 29/66* (2006.01)
*H01L 43/12* (2006.01)
*H01L 43/08* (2006.01)

(52) U.S. Cl.
CPC .......... *H01L 29/82* (2013.01); *H01L 29/66007* (2013.01); *H01L 43/08* (2013.01); *H01L 43/12* (2013.01)

(58) Field of Classification Search
USPC ......................................................... 257/421
See application file for complete search history.

(56) References Cited

U.S. PATENT DOCUMENTS

| 6,198,608 B1 * | 3/2001 | Hong et al. ................... 360/320 |
| 8,299,552 B2 * | 10/2012 | Nagase et al. ................ 257/421 |
| 8,421,051 B2 * | 4/2013 | Sato et al. ........................ 257/4 |
| 8,686,521 B2 * | 4/2014 | Daibou et al. ................ 257/421 |
| 8,710,605 B2 * | 4/2014 | Takahashi et al. ............. 257/427 |
| 2003/0134096 A1 * | 7/2003 | Chen et al. ..................... 428/209 |
| 2006/0234445 A1 * | 10/2006 | Yang ............................. 438/257 |
| 2010/0244163 A1 * | 9/2010 | Daibou et al. ................ 257/421 |
| 2011/0031463 A1 * | 2/2011 | Sato et al. ........................ 257/4 |
| 2011/0037046 A1 * | 2/2011 | Sato et al. ........................ 257/4 |
| 2012/0074511 A1 * | 3/2012 | Takahashi et al. ............. 257/427 |

(Continued)

FOREIGN PATENT DOCUMENTS

JP    2002359416 A    * 12/2002    ............. H01L 43/08
JP    2009-81314        4/2009

OTHER PUBLICATIONS

English machine translation of JP 2002359416 cited above.*

(Continued)

*Primary Examiner* — Earl Taylor
(74) *Attorney, Agent, or Firm* — Oblon, McClelland, Maier & Neustadt, L.L.P.

(57) ABSTRACT

According to one embodiment, a magnetic memory element includes a first magnetic layer having a first surface and a second surface being opposite to the first surface, a second magnetic layer, an intermediate layer which is provided between the first surface of the first magnetic layer and the second magnetic layer, a layer which is provided on the second surface of the first magnetic layer, the layer containing B and at least one element selected from Hf, Al, and Mg, and an insulating layer which is provided on a sidewall of the intermediate layer, the insulating layer containing at least one element selected from the Hf, Al, and Mg contained in the layer.

11 Claims, 5 Drawing Sheets

(56) References Cited

U.S. PATENT DOCUMENTS

| | | | |
|---|---|---|---|
| 2013/0069182 A1* | 3/2013 | Ohsawa et al. | 257/421 |
| 2013/0248355 A1* | 9/2013 | Ohsawa et al. | 204/192.34 |
| 2013/0307099 A1* | 11/2013 | Kitagawa et al. | 257/421 |
| 2014/0084402 A1* | 3/2014 | Shimomura et al. | 257/427 |
| 2014/0087483 A1* | 3/2014 | Ohsawa et al. | 438/3 |
| 2014/0131649 A1* | 5/2014 | Daibou et al. | 257/2 |

OTHER PUBLICATIONS

U.S. Appl. No. 14/023,772, filed Sep. 11, 2013, Daibou, et al.

* cited by examiner

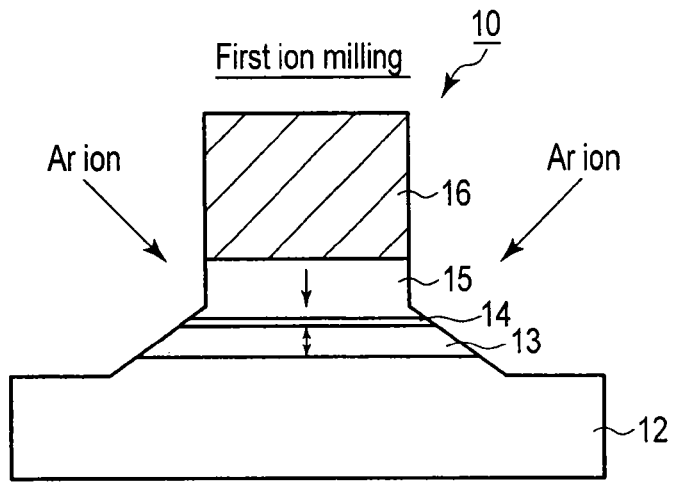
F I G. 3A
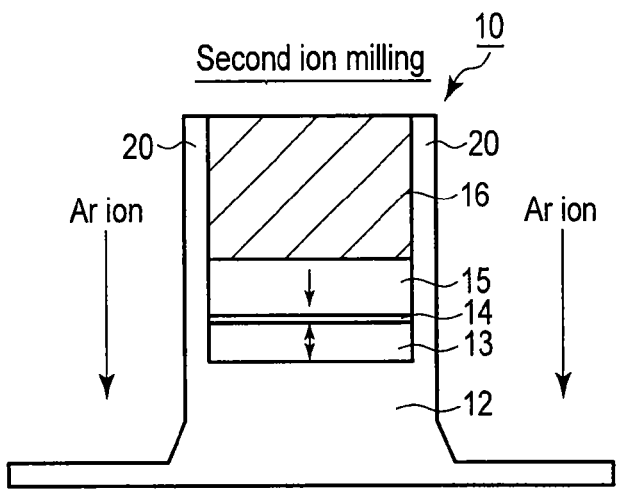
F I G. 3B
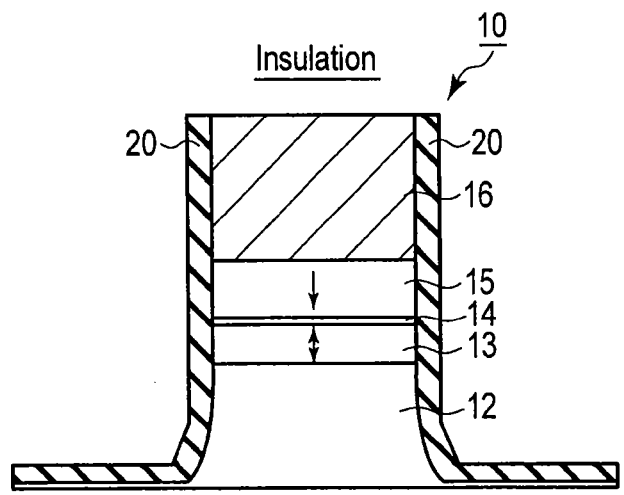
F I G. 3C

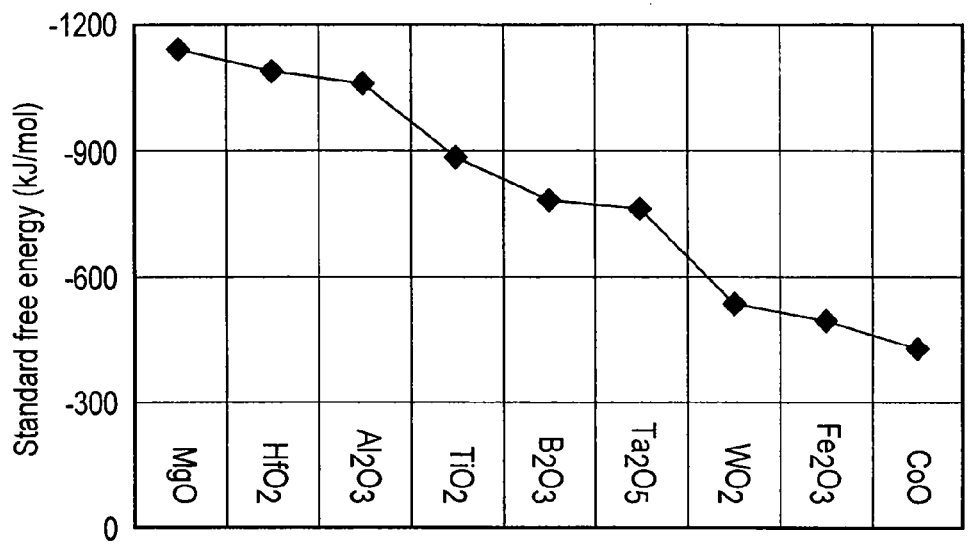
F I G. 4
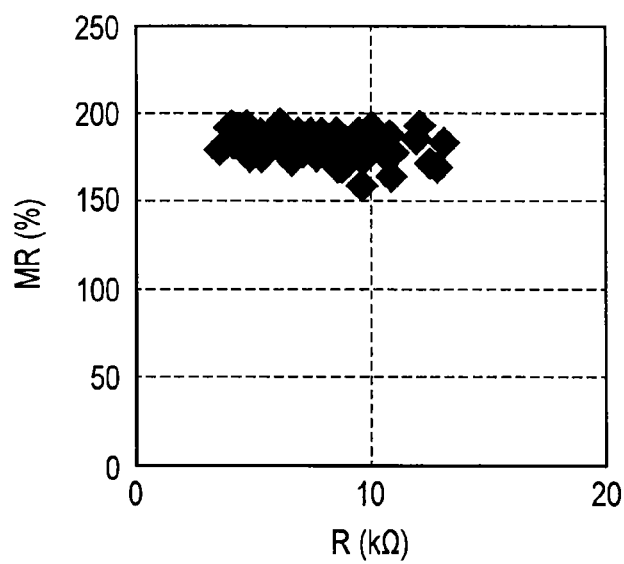
F I G. 5

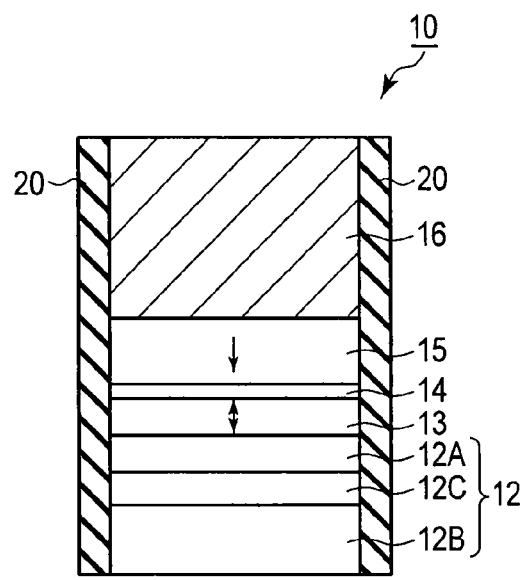
F I G. 8
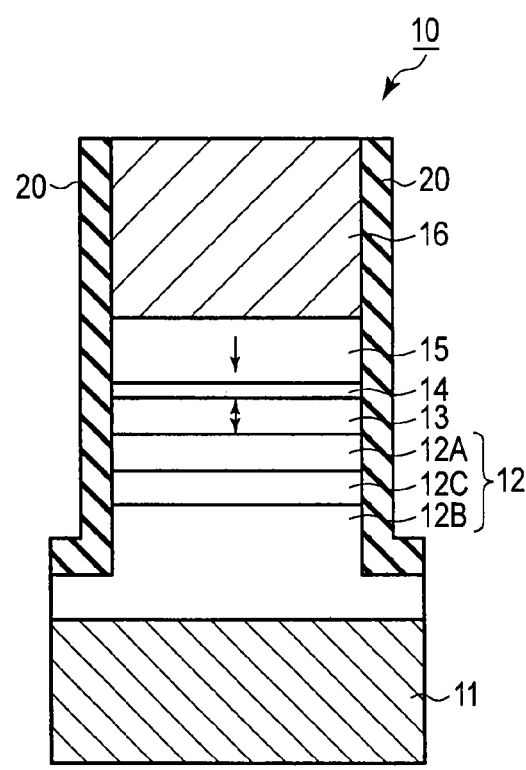
F I G. 9

MAGNETIC MEMORY ELEMENT AND METHOD OF MANUFACTURING THE SAME

CROSS-REFERENCE TO RELATED APPLICATIONS

This application is based upon and claims the benefit of priority from Japanese Patent Application No. 2012-114951, filed May 18, 2012, the entire contents of which are incorporated herein by reference.

FIELD

Embodiments described herein relate generally to a magnetic memory element and method of manufacturing the same.

BACKGROUND

An MTJ (Magnetic Tunnel Junction) element is used as a magnetic memory element of an MRAM (Magnetic Random Access Memory). An MTJ element 10 contains magnetic materials and insulating materials, such as MgO. Therefore, the MTJ element 10 is hardly processed by RIE (Reactive Ion Etching) using a halogen gas that is usually used in a semiconductor device field. When the RIE is used to process the MTJ element 10, a corrosion problem caused by a low corrosion resistance is generated. Additionally, unfortunately the etching cannot originally be performed to the MTJ element 10 because the MTJ element 10 contains many hardly-etched materials.

Therefore, as measures of the problems, ion milling in which an Ar ion of an inert gas is used is studied to process the MTJ element 10. However, in the ion milling in which the Ar ion is used, because an atom is physically flicked, a leak current is passed through a tunnel barrier layer of the MTJ element 10 by re-adhesion of the spattered atom. Accordingly, in the ion milling of the MTJ element 10, dielectric breakdown becomes problematic due to a re-deposition layer 20, and the MTJ element 10 free from a short circuit is hardly processed.

BRIEF DESCRIPTION OF THE DRAWING

FIGS. 3A, 3B and 3C are sectional views showing manufacturing steps of the MTJ element of the first embodiment;

FIG. 4 is a view illustrating standard free energy in the first embodiment when an oxide of various materials is made;

FIG. 5 is a view illustrating a correlation between a resistance (R) and a rate of resistance change (MR) of the MTJ element that is produced using the process in FIG. 3;

FIG. 8 is a sectional view illustrating an MTJ element according to a third embodiment; and FIG. 9 is a sectional view illustrating another MTJ element of the third embodiment.

DETAILED DESCRIPTION

Figure 1:
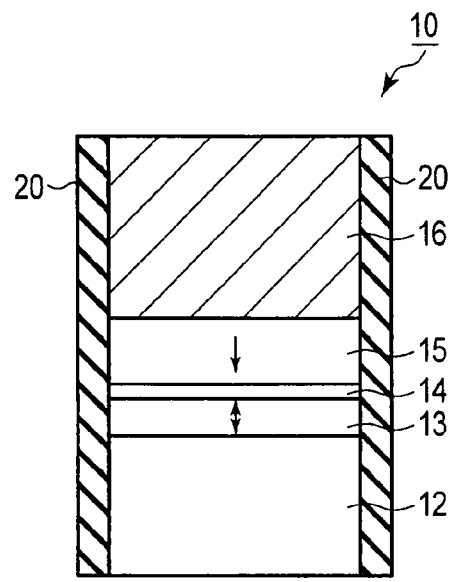
FIG. 1 is a sectional view illustrating an MTJ element according to a first embodiment.

In general, according to one embodiment, a magnetic memory element includes: a first magnetic layer having a first surface and a second surface being opposite to the first surface; a second magnetic layer; an intermediate layer which is provided between the first surface of the first magnetic layer and the second magnetic layer; a layer which is provided on the second surface of the first magnetic layer, the layer containing B and at least one element selected from a group consisting of Hf, Al, and Mg; and an insulating layer which is provided on a sidewall of the intermediate layer, the insulating layer containing at least one element selected from the group consisting of Hf, Al, and Mg contained in the layer.

Hereinafter, embodiments will be described with reference to the drawings. However, it is noted that the drawings are schematic and conceptual, and that a size, a ratio, and the like of each drawing are not always identical to the actual size, ratio, and the like. In the case that the same component is illustrated in the drawings, sometimes the size and the ratio vary. Particularly, the following embodiments illustrate a magnetic memory element in order to embody a technological thought of the present invention, but the technological thought of the present invention is not specified by a shape, a structure, a disposition, and the like of the component. In the following description, an element having the same function and configuration is designated by the same numeral, and repetitive description is made as needed basis.

[1] First Embodiment

[1-1] Configuration

A configuration of an MTJ element 10 (a magnetic memory element, and a magnetoresistance element) according to a first embodiment will be described with reference to FIGS. 1 and 2.

As illustrated in FIG. 1, the MTJ element 10 includes an underlayer 12, a memory layer 13, an intermediate layer 14, a reference layer 15, an upper electrode 16, and a deposition layer 20. In the MTJ element 10 in FIG. 1, the underlayer 12, the memory layer 13, the intermediate layer 14, the reference layer 15, and the upper electrode 16 are stacked in this order. The deposition layer 20 is formed on sidewalls of the underlayer 12, the memory layer 13, the intermediate layer 14, and the reference layer 15.

The underlayer 12 is formed while containing at least one element selected from a group consisting of Hf, Al, and Mg and B. For example, HfB, AlB, MgB, HfAlB, HfMgB, and MgAlB may be used as a material for the underlayer 12.

The deposition layer 20 is made of an insulating material containing at least one element identical to that contained in the underlayer 12. That is, the deposition layer 20 is made of an insulating material, which contains at least one element selected from the group consisting of Hf, Al, and Mg that are contained in the underlayer 12 or an insulating material, which contains at least one element selected from the group consisting of Hf, Al, and Mg and B that are contained in the underlayer 12. Nitriding or oxidation is performed to a material constituting the underlayer 12, whereby the deposition layer 20 becomes insulated. That is, the deposition layer 20 is made of a material in which the material constituting the underlayer 12 contains O (oxygen) or N (nitrogen). Examples of the oxygen-containing insulating materials for the deposition layer 20 include HfBO, AlBO, MgBO, HfAlBO, HfMgBO, and MgAlBO. Examples of the nitrogen-containing insulating materials for the deposition layer 20 include BN, MgN, AlN, AlBN, MgBN, and MgAlBN.

Each of the memory layer 13 and the reference layer 15 is made of a ferromagnetic material. In the case of the perpendicular magnetization type MTJ element 10 having perpendicular magnetic anisotropy, the memory layer 13 and the reference layer 15 have the magnetic anisotropy perpendicular to a film surface, and easy-axis-of-magnetization directions of the memory layer 13 and the reference layer 15 are oriented toward a direction perpendicular to the film surface.

For example, CoFeB having a film thicknesses of about 1.0 to about 1.4 nm may be used as the memory layer 13.

For example, an artificial lattice in which TbCoFe, Co, and Pt are stacked or a crystalline film in which FePt is order in L10 may be used as the reference layer 15. Polarizability of the reference layer 15 is improved by sandwiching CoFeB between the reference layer 15 and the intermediate layer 14 to be able to obtain a high MR ratio (magnetoresistance ratio).

The intermediate layer 14 is made of nonmagnetic materials, such as a nonmagnetic metal, a nonmagnetic semiconductor, and an insulator. For example, MgO having a film thickness of about 1 nm may be used as the intermediate layer 14. MgO is used as the intermediate layer 14 to be able to obtain the high MR ratio.

In addition to a function of an electrode, the upper electrode 16 is used as a mask in patterning the MTJ element 10. Therefore, desirably a material having a low electric resistance and a diffusion-tolerance and a material having an excellent etching-tolerance or ion-milling-tolerance are used as the upper electrode 16. For example, a stacked film of Ta/Ru is used as the upper electrode 16.

Figure 2:
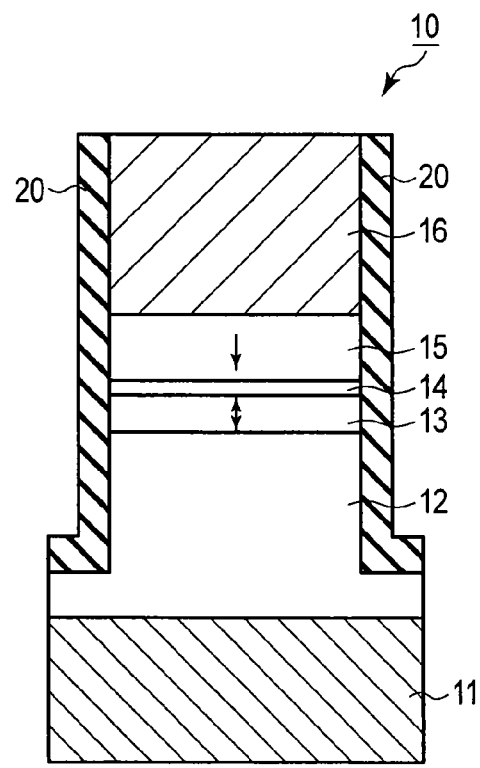
FIG. 2 is a sectional view illustrating another MTJ element of the first embodiment.

As illustrated in FIG. 2, the MTJ element 10 may include a lower electrode 11 below the underlayer 12. Desirably the material having the low electric resistance and the diffusion-tolerance is used as the lower electrode 11. For example, a stacked film of Ta/Cu/Ta is used as the lower electrode 11, Cu is used to reduce the electric resistance of the lower electrode 11, and Ta is used to improve the diffusion-tolerance.

In the MTJ element 10 in FIG. 2, a lower portion of the underlayer 12 and the lower electrode 11 are wider than an upper portion of the underlayer 12, the memory layer 13, the intermediate layer 14, the reference layer 15, and the upper electrode 16. The deposition layer 20 is formed on sidewalls of the upper portion of the underlayer 12, the memory layer 13, the intermediate layer 14, the reference layer 15, and the upper electrode 16 and the lower portion of the underlayer 12.

[1-2] Production Method

An example of a process of forming the MTJ element 10 of the first embodiment will be described with reference to FIGS. 3A to 3C.

As illustrated in FIG. 3A, the underlayer 12, the memory layer 13, the intermediate layer 14, the reference layer 15, and the upper electrode 16 are sequentially stacked. Then first ion milling is performed to process the MTJ element 10. The first ion milling is performed using inert gases (in the first embodiment, an Ar ion), such as Ar, Kr, and Xe. In the first ion milling, an incident angle of an ion is adjusted to an inclined direction (for example, a direction inclined by about 50° to a direction perpendicular to a film surface of the MTJ element 10) such that the deposition layer 20 is not formed on the sidewall of the intermediate layer 14. The first ion milling is performed until the upper portion of the underlayer 12 is processed.

As illustrated in FIG. 3B, the incident angle of the Ar ion is changed to the direction perpendicular to the film surface, and second ion milling is performed. In the second ion milling, the ion milling is further performed to the underlayer 12. As a result, part of the underlayer 12 to which the ion milling is performed by the Ar ion is deposited on the sidewall of the MTJ element 10 to form the deposition layer 20. In the second ion milling, desirably the incident direction of the ion is closer to the direction perpendicular to the film surface of the MTJ element 10 than the incident direction of the ion of the first ion milling.

As illustrated in FIG. 3C, the oxidation or the nitriding is performed to the deposition layer 20 deposited on the sidewall of the MTJ element 10, thereby forming the insulated deposition layer 20.

At this point, the oxidation of the deposition layer 20 is performed by exposing the deposition layer 20 to an atmosphere. However, the oxidation of the deposition layer 20 can be performed other than the exposure of the deposition layer 20 to the atmosphere. For example, in vacuum, the deposition layer 20 can sufficiently be oxidized by exposing the deposition layer 20 to an oxygen gas, a radical oxygen, a plasma oxygen, or a cluster oxygen ion.

For example, the nitriding of the deposition layer 20 is performed using a radical nitrogen, a plasma nitrogen, or a cluster nitrogen ion.

The oxidation or the nitriding of the deposition layer 20 may be performed irrespective of a valence state as long as an insulating property is ensured.

[1-3] Material for Deposition Layer 20

The underlayer 12 contains (i) at least one element selected from the group consisting of Hf, Al, and Mg and (ii) B. Desirably the deposition layer 20 is made of an insulating material containing at least (i) in (i) and (ii) constituting the underlayer 12. In the case that the deposition layer 20 is made of a nitride, the deposition layer 20 may be made of an insulating material containing at least (ii) in (i) and (ii) constituting the underlayer 12. The detailed description will be made below.

When the deposition layer 20 deposited on the sidewall of the intermediate layer 14 has a conductive property, a current is passed through the sidewall of the intermediate layer 14 to generate a trouble of a short circuit. In order to prevent the trouble of a short circuit, desirably the deposition layer 20 has resistivities of 0.0005 $\Omega cm^2$ or more. Even if the metal deposited on the intermediate layer 14 is insulated by the oxidation, when a breakdown-voltage-tolerance of the insulating layer is lower than that of the intermediate layer 14, a dielectric strength voltage is lowered to degrade an insulating property of repetitive read/write of the MTJ element 10. That is, desirably the material for the deposition layer 20 deposited on the sidewall of the intermediate layer 14 is a material of the same sort of the intermediate layer 14 or a material, which has the high dielectric-breakdown-tolerance when being oxidized. When MgO or MgO containing B is used as the intermediate layer 14, a breakdown voltage ranges from about 5 to about 20 MV/cm. Therefore, desirably the deposition layer 20 is made of MgO or MgBO or a material, in which the breakdown voltage becomes 5 MV/cm or more by the oxidation. Desirably an oxide, in which the material made by the combination of at least one element selected from the group consisting of Hf, Al, and Mg and B is oxidized, is used as the deposition layer 20.

In the process in FIG. 3C in which the deposition layer 20 is insulated by the oxidation, it is necessary to expose the deposition layer 20 to the oxygen gas, the radical oxygen, or the plasma oxygen. In the oxidation process of the deposition layer 20, when an oxygen content is excessively high, the memory layer 13 or the reference layer 15 is oxidized to degrade a magnetic property. Undesirably the degradation of the magnetic property causes the degradation of a thermal-agitation-tolerance. In the oxidation process of oxidizing the deposition layer 20, it is desirable that the deposition layer 20 can completely be oxidized although the magnetic material is not oxidized. That is, it is necessary that the deposition layer 20 be easily oxidized compared with the memory layer 13 or the reference layer 15.

As illustrated in FIG. 4, standard free energy AG (kJ/mol) of oxides of various materials (Mg, Hf, Al, Ti, B, Ta, W, Fe, and Co) varies. Magnesium oxide (MgO), hafnium oxide ($HfO_2$), aluminum oxide ($Al_2O_3$) has large negative standard free energy during the formation of the oxide. It is found that Mg, Hf, and Al are easily coupled to oxygen compared with Fe and Co that are mainly used in the memory layer 13 and the reference layer 15.

The material mainly containing Mg, Hf, or Al is deposited on the sidewall of the MTJ element 10, and the deposition layer 20 is weakly oxidized at a degree at which the memory layer 13 and the reference layer 15 are not oxidized, for example, only exposure of the deposition layer 20 to the oxygen gas. Therefore, the deposition layer 20 can sufficiently be oxidized, and the deposition layer 20 can becomes the good insulator.

The deposition layer 20 may be insulated by the nitriding. In this case, the resistance of the deposition layer 20 can be increased while an oxidation damage to the magnetic material is suppressed.

BN, MgN, and AlN are insulators having the good dielectric-breakdown-tolerance. Therefore, using the material mainly containing Mg, Al, or B as the underlayer 12, Mg, Al, or B is deposited on the sidewall of the intermediate layer 14 by the ion milling of the MTJ element 10, and the nitriding is performed to produce the MTJ element 10 free from the insulation defect.

Fe and Co used in the memory layer 13 have weak reactivity with nitrogen compared with oxygen. That is, when the material to which the nitriding is easily performed and the material having the good insulating property and breakdown-resistant voltage property after the nitriding are used as the deposition layer 20, the deposition layer 20 can be insulated by the nitriding while the degradation of the magnetic property due to the nitriding of the memory layer 13 or reference layer 15 is suppressed.

[1-4] Effect

According to the first embodiment, the underlayer 12 of the MTJ element 10 is made of the material containing at least one element selected from the group consisting of Hf, Al, and Mg and B. In the ion milling of the MTJ element 10, some atoms sputtered from the underlayer 12 are deposited on the sidewall of the MTJ element 10. The deposition layer is insulated to form the deposition layer 20, which is made of the insulator containing the element constituting the underlayer 12, on the sidewall of the MTJ element 10.

In the materials constituting the deposition layer 20, Hf, Al, or Mg are easily oxidized compared with the materials for the memory layer 13 and the reference layer 15, and the oxide of Hf, Al, or Mg has the high dielectric-breakdown-tolerance. In the materials constituting the deposition layer 20, the nitriding is easily performed to B, Al, or Mg compared with the materials for the memory layer 13 and the reference layer 15, and the nitride of B, Al, or Mg has the high dielectric-breakdown-tolerance. Additionally, B is contained in the material constituting the underlayer 12, so that a spin pumping effect can be suppressed to implement low-current write. Therefore, according to the first embodiment, the MTJ element 10 free from the insulating defect can be constructed.

Generally, when the conductive property is left in the deposition layer 20 deposited on the sidewall of the intermediate layer 14, a rate of resistance change MR of the MTJ element decreases with decreasing resistance R of the MTJ element 10. On the other hand, in the first embodiment, as can be seen from FIG. 5, the rate of resistance change MR of the MTJ element does not decrease at the low resistance R, and the degradation of the rate of resistance change MR due to the insulation defect of the deposition layer 20 is not generated.

[2] Second Embodiment

A second embodiment is an example in which two underlayers 12 are formed. In the second embodiment, the same description as the first embodiment is omitted.

[2-1] Configuration

A configuration of the MTJ element 10 of the second embodiment will be described with reference to FIGS. 6 and 7.

Figure 6:
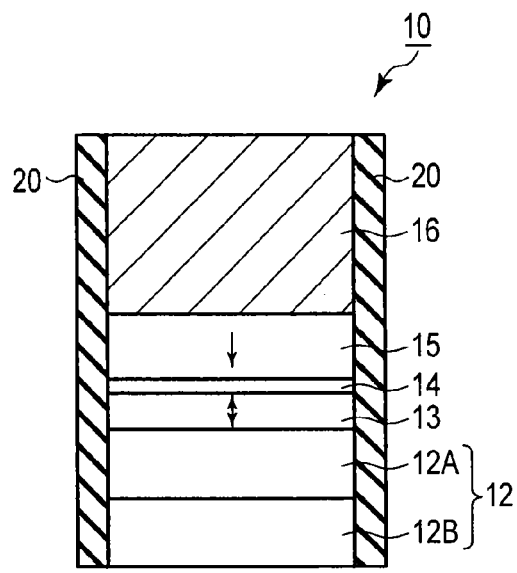
FIG. 6 is a sectional view illustrating an MTJ element according to a second embodiment.
Figure 7:
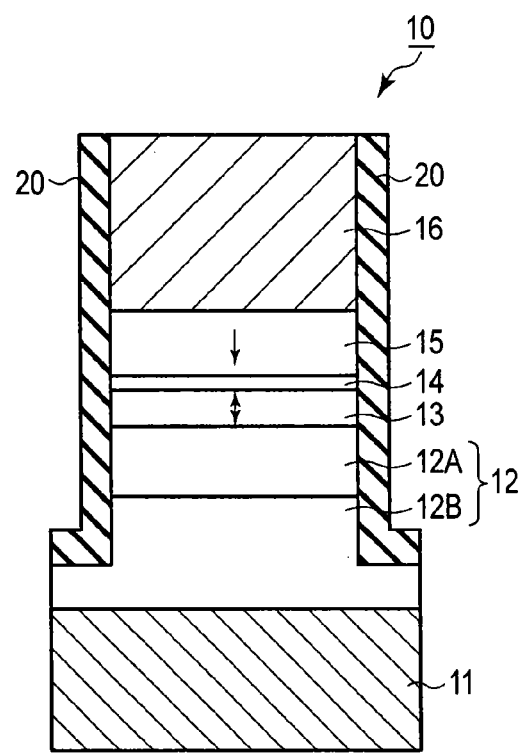
FIG. 7 is a sectional view illustrating another MTJ element of the second embodiment.

As illustrated in FIGS. 6 and 7, in the second embodiment, the underlayer 12 includes a first underlayer 12A and a second underlayer 12B. The first underlayer 12A is adjacent to the memory layer 13. The second underlayer 12B is adjacent to an opposite surface to the surface of the first underlayer 12A adjacent to the memory layer 13.

A material in which the small spin pumping effect is reduced may be used as the first underlayer 12A. For example, a nitride (AlTiN and TiN) containing AlTi or Ti is used as the first underlayer 12A. When the material having the small spin pumping effect is used as the first underlayer 12A, a friction coefficient of the memory layer 13 is decreased to be able to reduce the write current.

A material to which the oxidation or the nitriding is easily performed when the second underlayer 12B is deposited on the sidewall of the intermediate layer 14 and a material that has the high breakdown voltage when the oxidation or the nitriding is performed may be used as the second underlayer 12B. For example, similarly to the underlayer 12 of the first embodiment, the second underlayer 12B is formed while containing at least one element selected from the group consisting of Hf, Al, and Mg and B. However, it is not always necessary that B be contained in the second underlayer 12B.

Desirably the second underlayer 12B is thicker than the first underlayer 12A. This is because the surface of the lower electrode 11 is not exposed in patterning the MTJ element 10.

The deposition layer 20 of the second embodiment is made of the insulating material containing at least one element selected from the group consisting of Hf, Al, and Mg contained in the second underlayer 12B or the insulating material containing at least one element selected from a group consisting of Hf, Al, and Mg and B contained in the second underlayer 12B.

In the second embodiment, because the underlayer 12 is constructed by the two layers, the first underlayer 12A is interposed between the second underlayer 12B and the memory layer 13. In this case, the second underlayer 12B is not limited to the material containing Hf, Al, Mg, and B as long as the second underlayer 12B becomes the insulator after being deposited on the sidewall of the intermediate layer 14.

[2-2] Effect

In the second embodiment, the underlayer 12 is constructed by the two layers, the first underlayer 12A is formed by the nitriding, and the second underlayer 12B is made of the same material as the underlayer 12 of the first embodiment. Therefore, by the deposition layer 20, which is deposited on the sidewall of the MTJ element 10 and made of the insulator, the dielectric breakdown due to the sidewall of intermediate layer 14 can be prevented, and the high MR and the low-current write can be implemented.

[3] Third Embodiment

A third embodiment is an example in which a third underlayer 12C is provided between the first underlayer 12A and the second underlayer 12B of the second embodiment. In the third embodiment, the same point as the first and second embodiments is omitted.

[3-1] Configuration

A configuration of the MTJ element 10 of the third embodiment will be described with reference to FIGS. 8 and 9.

As illustrated in FIGS. 8 and 9, the underlayer 12 of the third embodiment is formed by the first underlayer 12A, the second underlayer 12B, and the third underlayer 12C. The third underlayer 12C is formed between the first underlayer 12A and the second underlayer 12B.

A material in which the friction coefficient of the memory layer 13 is decreased may be used as the first underlayer 12A. For example, a nitride (AlTiN and TiN) containing AlTi or Ti is used as the first underlayer 12A.

A material to which the oxidation or the nitriding is easily performed when the second underlayer 12B is deposited on the sidewall of the intermediate layer 14 and a material that has the high breakdown voltage when the oxidation or the nitriding is performed may be used as the second underlayer 12B. For example, similarly to the underlayer 12 of the first embodiment, the second underlayer 12B is formed while containing at least one element selected from the group consisting of Hf, Al, and Mg and B.

Desirably a metal that does not contain B is used as the third underlayer 12C. For example, Hf can be used as the third underlayer 12C.

The third underlayer 12C may contain boron. In this case, desirably a boron amount of the second underlayer 12B is greater than that of the third underlayer 12C. This is because the diffusion of the boron is prevented.

Desirably the second underlayer 12B is thicker than that of the first underlayer 12A or the third underlayer 12C. This is because the surface of the lower electrode 11 is not exposed in patterning the MTJ element 10.

[3-2] Effect

In the third embodiment, not only the same effect as the first and second embodiments can be obtained, but also the following effect can also be obtained.

When the first underlayer 12A made of the nitride is formed on the second underlayer 12B containing the boron, depending on the deposition process, sometimes the boron in the second underlayer 12B is coupled to the nitrogen in the first underlayer 12A to form an insulating film. When the underlayer 12 is insulated, undesirably the degradation of the MR ratio is generated.

In the third embodiment, the third underlayer 12C is sandwiched between the first underlayer 12A made of the nitride and the second underlayer 12B containing the boron. Therefore, the nitriding of the second underlayer 12B can be prevented, and the degradation of the MR ratio can be suppressed.

In the embodiments, B, N, O, or C may be mixed in the "nitride" and the "oxide", and the "nitride" and the "oxide" may be a "nitrogen inclusion" and an "oxygen inclusion".

In the embodiments, the magnetic layer adjacent to the underlayer 12 is the memory layer 13. Alternatively, the dispositions of the memory layer 13 and the reference layer 15 can be switched.

In the embodiments, the deposition layer 20 is formed on all the sidewalls of the underlayer 12, the memory layer 13, the intermediate layer 14, and the reference layer 15. Alternatively, the deposition layer 20 may be formed on at least the sidewall of the intermediate layer 14.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetic memory element comprising:
   a first magnetic layer having a first surface and a second surface being opposite to the first surface;
   a second magnetic layer;
   an intermediate layer which is provided between the first surface of the first magnetic layer and the second magnetic layer;
   a layer which is provided on the second surface of the first magnetic layer, the layer containing B and Hf; and
   an insulating layer which is provided on a sidewall of the intermediate layer, the insulating layer containing Hf.

2. The element according to claim 1, wherein the insulating layer contains B.

3. The element according to claim 1, wherein the insulating layer is made of an oxide or a nitride.

4. A magnetic memory element comprising:
   a first magnetic layer having a first surface and a second surface being opposite to the first surface;
   a second magnetic layer;
   an intermediate layer which is provided between the first surface of the first magnetic layer and the second magnetic layer;
   a first layer which is provided on the second surface of the first magnetic layer, the first layer containing N and having a third surface and a fourth surface being opposite to the third surface, the third surface facing the second surface;
   a second layer which is provided on the fourth surface of the first layer, the second layer containing B and at least one element selected from Hf, Al, and Mg; and
   an insulating layer which is provided on a sidewall of the intermediate layer, the insulating layer containing at least one element selected from the Hf, Al, and Mg.

5. The element according to claim 4, further comprising:
   a third layer which is provided between the first layer and the second layer, the third layer containing at least one element selected from Hf, Al, and Mg.

6. The element according to claim 5, wherein the third layer contains B, and a B amount of the second layer is greater than a B amount of the third layer.

7. The element according to claim 4, wherein the insulating layer contains B.

8. The element according to claim 4, wherein the insulating layer is made of an oxide or a nitride.

9. The element according to claim 1, wherein the layer is conductive.

10. The element according to claim 4, wherein the first and second layers are conductive.

11. The element according to claim 5, wherein the first to third layers are conductive.

* * * * *